United States Patent
Bakker et al.

(10) Patent No.: US 6,501,308 B2
(45) Date of Patent: Dec. 31, 2002

(54) GENERATION OF CLOCK SIGNALS FOR A SEMICONDUCTOR MEMORY THAT ARE EDGE-SYNCHRONOUS WITH THE OUTPUT SIGNALS OF A CLOCK GENERATOR

(75) Inventors: Peter Bakker, Munich (DE); Fred S. Rennig, Freising (DE)

(73) Assignee: Texas Instruments Deutschland, GmbH, Freising (DE)

( * ) Notice: Subject to any disclaimer, the term of this patent is extended or adjusted under 35 U.S.C. 154(b) by 0 days.

(21) Appl. No.: 09/972,217

(22) Filed: Oct. 5, 2001

(65) Prior Publication Data
US 2002/0067194 A1 Jun. 6, 2002

(30) Foreign Application Priority Data
Nov. 13, 2000 (DE) .......................... 100 56 164

(51) Int. Cl.[7] .................................. H03L 7/06
(52) U.S. Cl. ........................ 327/156; 327/155
(58) Field of Search ..................... 327/155, 156, 327/158, 163; 331/25; 375/373, 375, 376

(56) References Cited
U.S. PATENT DOCUMENTS 5,774,511 A * 6/1998 Boerstler .................... 327/291
6,066,988 A * 5/2000 Igura .......................... 327/142
6,288,977 B1 * 9/2001 Yoshida et al. ............. 368/187
6,396,320 B2 * 5/2002 Saeki ......................... 327/156

* cited by examiner

Primary Examiner—Tuan T. Lam
Assistant Examiner—Linh Nguyen
(74) Attorney, Agent, or Firm—Bret J. Petersen; W. James Brady; Frederick J. Telecky, Jr.

(57) ABSTRACT

The circuit configuration for the generation of clock signals for a semiconductor memory (14) that are edge-synchronous with the output signals of a clock generator (16) comprises an input stage (20) to which the output signals of the clock generator (16) are applied. It furthermore contains a phase detector (30) which receives the signals output by the input stage (20) and whose output signals control a voltage-controlled oscillator (34) which supplies the clock signals for the semiconductor memory (14). It also contains a conversion stage (42) which applies signals related to the output signals of the oscillator (34) to the phase detector (30), which controls the oscillator in such a way that the phase difference between the signals reaching it from the input stage (20) and the signals also reaching it from the conversion stage (42) becomes zero. The input stage (20) comprises an amplifier (44) containing a circuit component (62) capable of influencing the signal transit time. This circuit component (62) is controlled in such a way as to change the signal transit time in inverse proportion to the changes of the output signals of the clock generator (16).

4 Claims, 1 Drawing Sheet

GENERATION OF CLOCK SIGNALS FOR A SEMICONDUCTOR MEMORY THAT ARE EDGE-SYNCHRONOUS WITH THE OUTPUT SIGNALS OF A CLOCK GENERATOR

FIELD OF THE INVENTION

The invention relates to a circuit configuration for the generation of clock signals for a semiconductor memory that are edge-synchronous with the output signals of a clock generator, comprising an input stage to which the output signals of the clock generator are applied, a phase detector which receives the signals output by the input stage and whose output signals control a voltage-controlled oscillator which supplies the clock signals for the semiconductor memory, and a conversion stage which applies signals related to the output signals of the oscillator to the phase detector, that controls the oscillator in such a way that the phase difference between the signals reaching it from the input stage and the signals also reaching it from the conversion stage becomes zero.

BACKGROUND OF THE INVENTION

The essential components found on the motherboard of modern computers, apart from the processor (CPU), also comprise, among others, a clock generator which supplies all the clock signals required for the control of the component units. It is especially important for the coordinated operation of the processor and the semiconductor memories, which constitute the main memory, that both the processor and the main memory are controlled with as much edge-synchronization as possible by the corresponding clock signals. Only when this condition is fulfilled, can the correct processing of data as well as the correct interchange of data be guaranteed.

Since the voltage values of the clock generator output signals cannot be used directly for the control of the semiconductor memory components, constituting the main memory, these output signals are usually applied to the main memory via a PLL circuit, thus ensuring that these output signals are converted to the correct driving levels. The PLL circuit is the cause of a certain delay of the signals output by it with respect to the clock generator output signals reaching it. For a given voltage value of the clock generator output signals, the circuit can be optimized in such a way that the time delay due to the PLL circuit can still be tolerated and thus does not contribute to the deterioration of the data transfer process between the processor and the main memory.

The clock generators of modern motherboards are, however, conceived in such a way that they can supply output signals of different voltage values to suit the requirements of different processors that may be fitted to the motherboard. The consequence of these different output signal voltage values is that the requirements regarding the transit time differences that can be tolerated with respect to the time delay between the clock signals controlling the processor, and the clock signals controlling the main memory, can no longer be satisfied.

SUMMARY OF THE INVENTION

The invention rests, therefore, on the requirement of providing a circuit configuration of the type described in the foregoing which makes it possible that the requirement for an edge-synchronous control of the processor as well as the main memory can also be satisfied even when the voltage values of the output signals supplied by the clock generator change as a result of the need to adapt them to different processors.

According to the invention, this requirement is satisfied in that the input stage contains an amplifier which comprises a circuit component that influences the signal transit time, and that this circuit component is controlled in such a way that it changes the signal transit time in inverse proportion to the changes of the clock generator output signal voltage level.

As a result of the use of this special input stage, the circuit configuration according to the invention ensures that any change of the voltage level of the output signals supplied by the clock generator will not affect the signal transit time, so that, in conjunction with the function of the PLL circuit, the conditions of the edge-synchronicity demanded can be adhered to.

BRIEF DESCRIPTION OF THE DRAWINGS

The invention shall now be explained in detail, with reference to the drawings, where.

DETAILED DESCRIPTION OF THE EMBODIMENTS

Figure 1:
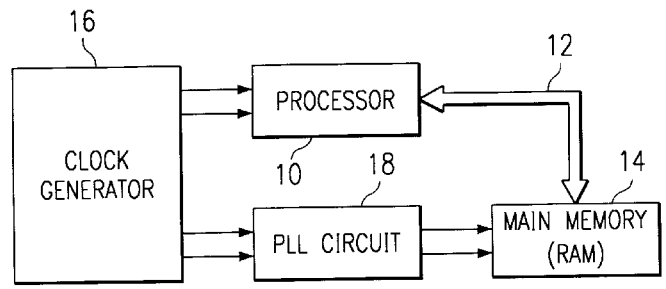
FIG. 1 is a schematic block diagram of a computer configuration where, however, only those component parts necessary for the explanation of the invention are represented.

The block diagram of FIG. 1 shows essential components of a modern computer, which are to be found on a so-called motherboard. These main components obviously include in the first place the processor 10, also referred to as the CPU. This processor 10 is connected to a main memory 14 by means of a bus rail 12. A clock generator 16 supplies at its output clock signals which are applied both to the processor 10 as well as to the main memory 14. Since the main memory 14 is made up of semiconductor memory components for whose control clock signals with other voltage values than the signals supplied by the clock generator 16 are required, a PLL circuit 18 is inserted between the clock generator 16 and the main memory 14 which, apart from its function as a phase locked loop, also takes care of the necessary conversions for the supply of the required voltage values.

The structure of the PLL circuit 18 shall now be explained in more detail with reference to the FIG. 2. The PLL circuit 18 comprises an input stage 20 whose two inputs 22 and 24 receive the output signals from the clock generator 16. These two signals are identical as far as their temporal behavior is concerned, but are complementary to each other with respect to their voltage levels. The clock generator 16 supplies these signals at any given time both in their direct and in their inverted form, since the input stage 20 is a stage with a differential input. The signal leaving the output 26 of the input stage 20 is a signal with digital levels, that is to say a signal that, as a function of the frequency of the signals output by the clock generator 16, assumes alternatively the value of either "L" or "H".

This output signal of the input stage 20 is applied to an input 28 of a phase detector 30, which compares its phase position with the phase position of a further signal applied to its other input 32 and, as a function of the result of this comparison, outputs an analogue control signal to a voltage-controlled oscillator 34. An output stage 36, which may be part of the voltage-controlled oscillator 34 but which is here represented as an individual stage for the purpose of simplifying the description, supplies clock signals at its outputs 38 and 40, the frequency of which corresponds to the frequency of the output signals of the clock generator 16, but whose voltage values are suitable for the control of the main memory 14.

As can be seen, the clock signals from outputs 38 and 40 are also applied to a conversion stage 42 which generates signals with the digital values "L" and "H" from the signals applied to it, and feeds these to the input 32 of the phase detector 30. The conversion stage 42 is here part of the control loop of the PLL circuit. The phase detector 30 in the PLL circuit ensures in the known way that the phase difference of the signals applied to its inputs 28 and 32 becomes zero by controlling the voltage controlled oscillator 34 by means of its output signal in such a way that this phase relationship of its input signals is achieved.

If, for example, the voltage of the clock generator output signals at the input of the input stage 20 has the value of 0.85 V, then a signal will be present at the output 26 which has a phase position that depends on settings in the input stage 20 which will be explained later on. The PLL circuit 18 now ensures that the signals at the outputs 38 and 40 have a phase position such as to make the phase difference at the inputs 28 and 32 zero. This phase position at the outputs 38 and 40 is the phase position of the clock signals with which the main memory 14, controlled by the PLL circuit 18, has to be controlled to ensure the correct operating co-ordination with the processor 10. If the voltage value of the clock control signals at the inputs 24 and 22 has to be changed to, for example, 0.6 V, to adapt it to the requirements of another processor 10, this would result in a change of the phase position of the signal coming from the output 26 and applied to the input 28 of the phase detector 30, if no changes were made to the input stage 20. The phase detector 30 would then detect a phase difference between the signals present at the inputs 28 and 32, and would output a signal to change the phase position of the signals at the outputs 38 and 40 in such a way as to make this phase difference disappear. This shows that a change of the voltage of the clock generator output signals would result in a phase shift of the clock signals of the main memory, if the input stage 20 were not designed in a special way. The manner in which the input stage 20 has to be structured, in order to counteract such changes of the phase position of the clock signals at the outputs 38 and 40, shall now be explained with reference to FIG. 3.

Figure 3:
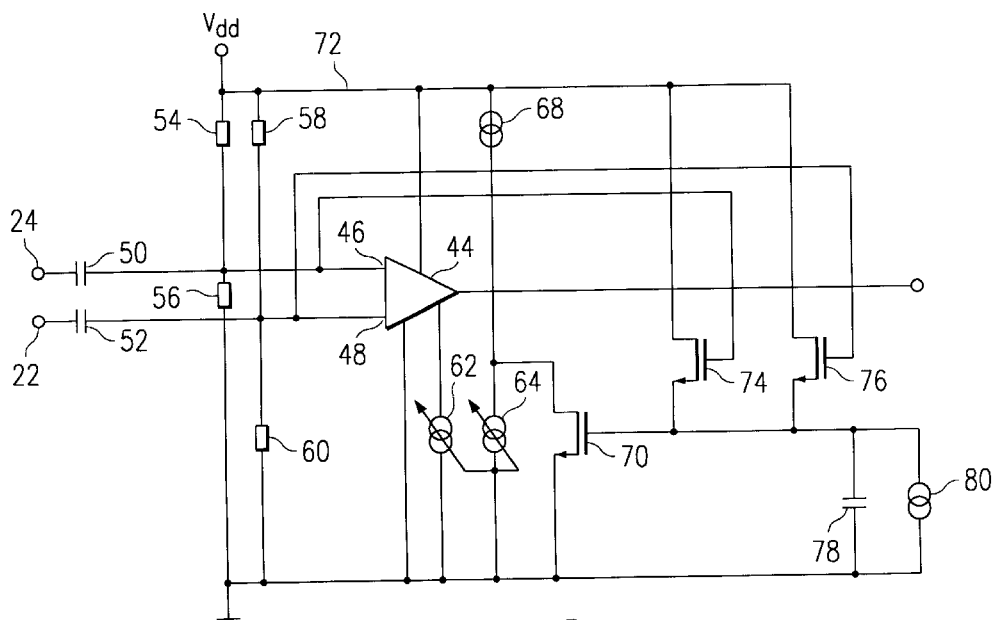
FIG. 3 is a circuit diagram of an exemplified embodiment of the input stage for use in the PLL circuit of FIG. 2.

The central component of the input stage according to FIG. 3 is a differential amplifier 44, having an input 46 and an input 48. The clock generator output signals arriving at the inputs 24 and 22 are applied to these two inputs by way of the coupling capacitors 50 and 52, respectively. The average level of these signals as applied to the inputs 46 and 48 is determined by the potential dividers consisting of the resistors 54, 56 and 58, 60, respectively. The differential amplifier 44 contains a current source 62, which forms an integral part of the amplifier, but which is shown separately and outside of the amplifier for the purpose of this explanation and the representation. The current flowing through this current source 62 determines the amplification factor of the differential amplifier 44 and also affects, in the known way, the signal transit time through the amplifier.

A further current source 64 is assigned to the current source 62 in the manner of a current mirror, which means that the current flowing through the current source 64 is mirrored and so also flows through the current source 62. The current source 62 is here in the output branch of the current mirror circuit, whilst the current source 64 is in its input branch. By influencing the current flowing through the current source 64 it becomes therefore possible to exert an influence on the amplification factor of the differential amplifier 44, and therefore on its signal transit time, by changing the current flowing through he current source 62.

As can be seen, the current source 64 is connected in series with a further current source 68, which serves the purpose of setting the basic current flowing through the current source 64.

Parallel to the current source 64 is a field effect transistor 70 between whose gate and the supply rail 72 are arranged two field effect transistors 74 and 76, the gates of which being connected to the input 46 and the input 48, respectively. A capacitor 78 and a current source 80 are furthermore arranged between the gate connection of the field effect transistor 70 and the ground rail.

The operation of the input stage 20, represented in FIG. 3, is as follows:

Let it be assumed that clock generator output signals at a pre-determined voltage level are present at the inputs 24 and 22. These signals are applied respectively to the inputs 46 and 48 of the differential amplifier 44 by way of the coupling capacitors 50 and 52. The voltage values present at the inputs 46 and 48 are also applied to the gates of the field-effect transistors 74 and 76, respectively, so that, as a function of these voltage values, a current can flow through these field-effect transistors. This current produces a voltage level at the gate of the field-effect transistor 70, which determines the current flowing through this field-effect transistor 70. Making reference to FIG. 3, the current flowing through the current source 68 can only flow into both the current source 64 and into the field-effect transistor 70. This means that the current flowing through the current source 64 can be influenced by the current flowing through the field-effect transistor 70. As has already been mentioned, the current flowing through the current source 62 corresponds to the current that also flows through the current source 64, on account of the current mirroring effect involved. Since this current is a function of the voltage values present at the inputs 46 and 48 of the differential amplifier 44, it follows that the current flowing through the current source 62 can be influenced by the voltage levels present at these inputs 46 and 48. Because, as has been mentioned, the current flowing through the current source 62 also determines the signal transit time through the differential amplifier 44 as a function of its amplification factor, the circuit has the effect that the signal transit time becomes variable as a function of the voltage values output by the clock generator. The lower the voltage of these output signals, the greater becomes the current flowing through the current source 62, since a lower proportion of the current from the current source 68 is drained off to the ground rail via the field-effect transistor 70. A larger current flowing through the current source 62 results in a higher amplification factor of the differential amplifier 44 and, therefore, in a shortersignal transit time of the signals passing through the input stage.

Therefore, by using the input stage 20, it becomes possible to achieve the adaptation of the phase position, described above, of the signal applied to the input 28 of the phase detector 30 to the changed voltage values of the clock generator output signals.

Figure 2:
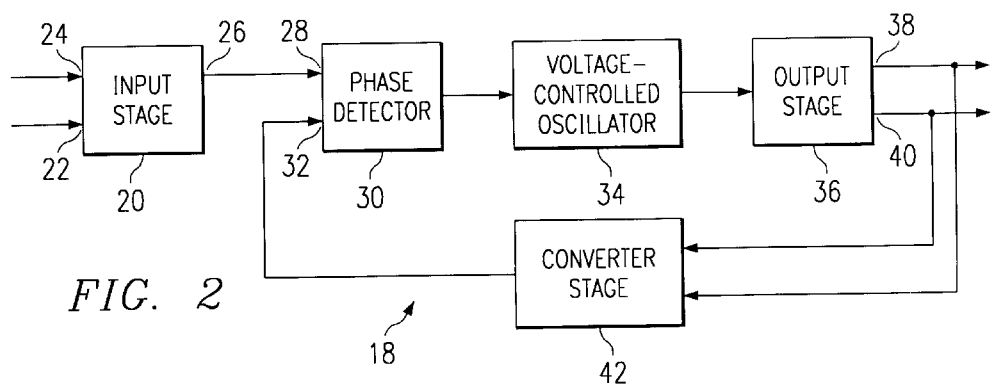
FIG. 2 is a block diagram of the PLL circuit of FIG. 1.

The converter stage 42 shown in FIG. 2 has the same structural configuration as the input stage of FIG. 3. On account of the differential amplifier contained in it, it therefore also achieves the adaptation of the signal transit time to the voltage values of the clock signals output by the PLL circuit 18. These signals, however, change very little, as they depend on the changes of the environmental parameters, in particular the temperature, within which the PLL circuit 18 is put to use. By giving the converter stage 42 the same structural design as the input stage 20, a more precise synchronicity of the clock signals controlling the processor 10, on the one hand, and the main memory 14, on the hand, is achieved.

In a practical application instance, the voltage values of the clock generator output signals can be varied between 0.5 V and 0.85 V for the purpose of adapting them to different processors. The PLL circuit 18 outputs voltage levels, required for the control of the main memory, of a mean value of 1.65 V with a voltage excursion span of 2 V, that is voltage levels between 0.65 V and 2.65 V.

What is claimed is:

1. A circuit configuration for the generation of clock signals for a semiconductor memory that are edge-synchronous with the output signals of a clock generator, comprising:

an input stage to which the output signals of the clock generator are applied, a phase detector which receives the signals output by the input stage and whose output signals control a voltage-controlled oscillator which supplies the clock signals for the semiconductor memory, and a conversion stage which applies signals related to the output signals of the oscillator to the phase detector, which controls the oscillator in such a way that the phase difference between the signals reaching it from the input stage and the signals also reaching it from the conversion stage becomes zero, wherein the input stage (20) comprises an amplifier (44) containing a circuit component (62) for influencing the signal transit time, and that this circuit component (62) is controlled in such a way as to change the signal transit time in inverse proportion to the changes of the output signals of the clock generator (16).

2. Circuit configuration according to claim 1, where the circuit component is a current source (62) which influences the amplification factor and therefore the signal transit time of the amplifier (44) related to it.

3. Circuit configuration according to claim 2, where the current source (62) is located in the output branch of a current mirror circuit, by means of which the current value flowing through the current source (62) can be adjusted and where the current value that can be mirrored into the output branch by means of the current mirror circuit can be changed to suit the voltage level of the output signals of the clock generator (16).

4. Circuit configuration according to claim 3, where a field-effect transistor (70) is connected in parallel with a current source (64) located in the input branch of the current mirror circuit which, depending on the voltage level of the output signals of the clock generator, channels more or less current from the input branch of the current mirror circuit to ground, so that a correspondingly decreased current is mirrored into the output branch of the current mirror circuit in order to change the amplification factor of the amplifier (44).

* * * * *